(12) United States Patent
Oh et al.

(10) Patent No.: US 11,367,753 B2
(45) Date of Patent: Jun. 21, 2022

(54) DISPLAY DEVICE

(71) Applicant: Samsung Display Co., Ltd., Yongin-si (KR)

(72) Inventors: Eon Seok Oh, Seongnam-si (KR); Woo Sik Jeon, Hwaseong-si (KR); Sang Yeol Kim, Hwaseong-si (KR); Han Ggoch Nu Ri Jo, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 22 days.

(21) Appl. No.: 16/386,139

(22) Filed: Apr. 16, 2019

(65) Prior Publication Data

US 2019/0355793 A1    Nov. 21, 2019

(30) Foreign Application Priority Data

May 16, 2018    (KR) .......................... 10-2018-0055959

(51) Int. Cl.
  *H01L 51/00*    (2006.01)
  *H01L 27/32*    (2006.01)
  *H01L 51/52*    (2006.01)

(52) U.S. Cl.
  CPC ...... *H01L 27/3218* (2013.01); *H01L 27/3246* (2013.01); *H01L 51/5253* (2013.01)

(58) Field of Classification Search
  CPC ............. H01L 27/3218; H01L 27/3246; H01L 51/5253; H01L 27/3211; H01L 51/504
  See application file for complete search history.

(56) References Cited

U.S. PATENT DOCUMENTS

| | | | | |
|---|---|---|---|---|
| 6,541,130 B2 * | 4/2003 | Fukuda | ............... | H01L 27/3211 257/88 |
| 6,566,807 B1 * | 5/2003 | Fujita | .................. | H01L 51/5012 313/504 |
| 7,019,331 B2 * | 3/2006 | Winters | ................ | H01L 27/322 257/79 |
| 7,259,514 B2 * | 8/2007 | Murayama | .......... | H01L 27/3211 313/504 |

(Continued)

FOREIGN PATENT DOCUMENTS

| | | |
|---|---|---|
| KR | 10-0623696 | 9/2006 |
| KR | 10-1094287 | 12/2011 |

(Continued)

*Primary Examiner* — Jay C Kim
(74) *Attorney, Agent, or Firm* — H.C. Park & Associates, PLC

(57) ABSTRACT

A display device includes a first electrode disposed on a substrate; a pixel defining layer including first through third exposure areas, each exposing at least part of the first electrode; first through third organic light emitting layers disposed in the first through third exposure areas, respectively; a second electrode disposed on the first through third organic light emitting layers; a first capping layer disposed on the second electrode and overlapping upper surfaces of the first through third organic light emitting layers; a second capping member disposed on the first capping layer, does not overlap the upper surface of the first organic light emitting layer, and overlaps only a portion of each of the upper surfaces of the second and third organic light emitting layers; and an encapsulation layer covering the second capping member.

20 Claims, 13 Drawing Sheets

(56) References Cited

U.S. PATENT DOCUMENTS

| | | | | |
|---|---|---|---|---|
| 7,400,088 B2* | 7/2008 | Ryu | | H01L 51/5265 313/504 |
| 7,518,141 B2* | 4/2009 | Nakamura | | H01L 51/5265 257/40 |
| 7,547,462 B2* | 6/2009 | Kim | | H01L 27/3211 313/504 |
| 7,601,988 B2* | 10/2009 | Seo | | H01L 27/156 257/102 |
| 7,623,199 B2* | 11/2009 | Domoto | | H01L 51/5265 313/504 |
| 7,755,577 B2* | 7/2010 | Kuba | | H01L 51/5265 313/498 |
| 7,923,920 B2* | 4/2011 | Nakamura | | H01L 51/5271 313/504 |
| 8,022,620 B2* | 9/2011 | Kobayashi | | H01L 51/5265 313/113 |
| 8,053,975 B2* | 11/2011 | Chun | | H01L 27/3211 313/504 |
| 8,183,564 B2* | 5/2012 | Takaya | | H01L 27/3211 257/40 |
| 8,288,784 B2* | 10/2012 | Cho | | H01L 51/5036 257/40 |
| 8,319,231 B2* | 11/2012 | Kajimoto | | H01L 27/3206 257/13 |
| 8,338,222 B2* | 12/2012 | Kim | | H01L 27/3211 438/99 |
| 8,339,033 B2* | 12/2012 | Yoshioka | | H01L 51/5265 313/503 |
| 8,349,632 B2* | 1/2013 | Lee | | H01L 27/3211 257/59 |
| 8,405,100 B2* | 3/2013 | Matsumoto | | H01L 27/3211 257/89 |
| 8,421,097 B2 | 4/2013 | Jeong et al. | | |
| 8,513,874 B2* | 8/2013 | Yoshioka | | H01L 51/5265 313/501 |
| 8,618,559 B2* | 12/2013 | Hamaguchi | | H01L 27/3218 257/40 |
| 8,680,543 B2* | 3/2014 | Takeda | | H01L 51/5265 257/40 |
| 8,803,137 B2* | 8/2014 | Lee | | H01L 51/52 257/40 |
| 8,803,853 B2* | 8/2014 | Seo | | G09G 3/3233 345/204 |
| 8,884,316 B2 | 11/2014 | Weaver et al. | | |
| 8,916,856 B2* | 12/2014 | Ishizuya | | H01L 51/5064 257/40 |
| 8,916,862 B2* | 12/2014 | Kurata | | H01L 51/5265 257/40 |
| 8,917,015 B2* | 12/2014 | Iwata | | H05B 33/22 313/504 |
| 8,933,471 B2* | 1/2015 | Kurata | | H01L 27/3211 257/40 |
| 8,957,579 B2 | 2/2015 | Weaver et al. | | |
| 8,980,662 B2* | 3/2015 | Lee | | C23C 14/042 438/34 |
| 9,024,521 B2* | 5/2015 | Yoshinaga | | H01L 51/56 313/504 |
| 9,059,113 B2* | 6/2015 | Kwon | | H01L 27/3211 |
| 9,065,052 B2* | 6/2015 | Kim | | H01L 51/0001 |
| 9,099,650 B2* | 8/2015 | Kim | | C23C 14/24 |
| 9,105,860 B2* | 8/2015 | Hwang | | H01L 51/0058 |
| 9,178,001 B2* | 11/2015 | Kwak | | H01L 51/5265 |
| 9,202,848 B2* | 12/2015 | Kim | | H01L 27/3211 |
| 9,343,509 B2* | 5/2016 | Kim | | H01L 51/5056 |
| 9,391,128 B2* | 7/2016 | Nomura | | H01L 51/5092 |
| 9,425,435 B2* | 8/2016 | Ando | | H01L 51/5265 |
| 9,455,420 B2* | 9/2016 | Kim | | H01L 51/5265 |
| 9,515,127 B2* | 12/2016 | Pyo | | H01L 27/3211 |
| 9,548,339 B2 | 1/2017 | Jeong | | |
| 9,577,205 B2* | 2/2017 | Yoo | | H01L 51/5265 |
| 9,647,220 B2* | 5/2017 | Yoshinaga | | C07D 493/04 |
| 9,666,819 B2* | 5/2017 | Park | | H01L 51/5004 |
| 9,831,454 B2* | 11/2017 | Park | | H01L 51/5004 |
| 9,923,030 B2* | 3/2018 | Kim | | H01L 51/5016 |
| 9,941,481 B2* | 4/2018 | Hosoumi | | H01L 51/5012 |
| 10,115,920 B2* | 10/2018 | Kim | | H01L 27/3211 |
| 10,121,829 B2* | 11/2018 | Ito | | H01L 51/5256 |
| 10,333,091 B2* | 6/2019 | Uesaka | | H01L 51/5088 |
| 10,340,473 B2* | 7/2019 | Choung | | H01L 51/5228 |
| 10,453,905 B2* | 10/2019 | An | | H01L 27/3262 |
| 10,483,479 B2* | 11/2019 | Tanaka | | H01L 51/5092 |
| 10,505,134 B2* | 12/2019 | Choi | | H01L 51/504 |
| 10,510,807 B2* | 12/2019 | Tsukamoto | | H01L 51/504 |
| 10,680,039 B2* | 6/2020 | Tsukamoto | | H01L 51/5265 |
| 10,811,490 B2* | 10/2020 | Choi | | H01L 27/3279 |
| 11,101,341 B2* | 8/2021 | Choi | | H01L 27/3279 |
| 2011/0233604 A1* | 9/2011 | Ikeda | | H01L 51/5036 257/103 |
| 2011/0240965 A1* | 10/2011 | Yoon | | H01L 27/3211 257/40 |
| 2013/0234121 A1* | 9/2013 | Sonoyama | | H01L 51/5012 257/40 |
| 2014/0027732 A1* | 1/2014 | Pyo | | H01L 51/5265 257/40 |
| 2018/0205040 A1* | 7/2018 | Kim | | H01L 51/5206 |

FOREIGN PATENT DOCUMENTS

| | | |
|---|---|---|
| KR | 10-2012-0139610 | 12/2012 |
| KR | 10-2015-0010384 | 1/2015 |
| KR | 10-2015-0019332 | 2/2015 |
| KR | 10-2016-0100026 | 8/2016 |

* cited by examiner

DISPLAY DEVICE

CROSS REFERENCE TO RELATED APPLICATIONS

This application claims priority from and the benefit of Korean Patent Application No. 10-2018-0055959, filed on May 16, 2018, which is hereby incorporated by reference for all purposes as if fully set forth herein.

BACKGROUND

Field

Exemplary implementations of the invention relate generally to a display device and, more particularly, to a display device exhibiting reduced white angular dependency (WAD) phenomenon.

Discussion of the Background

A display device is a device for displaying an image and includes a display panel such as an organic light emitting display panel or a liquid crystal display panel. An organic light emitting element used in the organic light emitting display panel is a self-luminous element. Light coming from the organic light emitting element is emitted to the outside through an upper substrate or a lower substrate. Here, due to the difference in refractive index between a light emitting layer of the organic light emitting element and a light transmitting surface, the efficiency of light extraction may be reduced at a certain viewing angle with respect to the front of the display. In particular, since short-wavelength light is greatly affected by viewing angle, a white angular dependency (WAD) phenomenon in which color and luminance change according to viewing angle may occur. The WAD phenomenon degrades the quality of a displayed image. Thus, research is being conducted to reduce the WAD phenomenon.

The above information disclosed in this Background section is only for understanding of the background of the inventive concepts, and, therefore, it may contain information that does not constitute prior art.

SUMMARY

Applicant discovered that the luminance ratio of red, blue and green light varies according to viewing angle, and that reducing the variation in luminance ratio between red, blue and green light at a given viewing angle reduces white angular dependency (WAD) phenomenon.

Display devices constructed according to exemplary implementations of the invention exhibit reduced WAD phenomenon. According to the principles and exemplary embodiments of the invention, the WAD phenomenon may be reduced by increasing the resonance efficiency or by increasing the light scattering effect of some of the light emitting elements. For example, the resonance efficiency may be adjusted be changing the relative sizes of the light emitting elements and/or a second capping layer may be provided to increase light scattering effect of some of the light emitting elements.

Additional features of the inventive concepts will be set forth in the description which follows, and in part will be apparent from the description, or may be learned by practice of the inventive concepts. According to one or more exemplary embodiments of the invention, a display device includes a first electrode disposed on a substrate; a pixel defining layer including a first exposure area, a second exposure area, and a third exposure area, each exposing at least part of the first electrode; a first organic light emitting layer, a second organic light emitting layer, and a third organic light emitting layer disposed in the first, second, and third exposure areas, respectively, each of the first, second, and third light emitting layers including an upper surface; a second electrode disposed on the first, second, and third organic light emitting layers; a first capping layer disposed on the second electrode and overlapping upper surfaces of the first, second, and third organic light emitting layers; a second capping member disposed on the first capping layer, the second capping member does not overlap the upper surface of the first organic light emitting layer, and overlaps only a portion of each of the upper surfaces of the second and third organic light emitting layers; and an encapsulation layer covering the second capping member.

The first organic light emitting layer might include a first lower charge transport layer stacked on a first organic element layer, and the second organic light emitting layer might include a second lower charge transport layer stacked on a second organic element layer, and wherein a thickness of the first lower charge transport layer and a thickness of the second lower charge transport layer are different from each other.

The thickness of the first lower charge transport layer might be greater than the thickness of the second lower charge transport layer.

The third organic light emitting layer might include a third lower charge transport layer stacked on a third organic element layer, and wherein the thickness of the second lower charge transport layer might be greater than a thickness of the third lower charge transport layer.

A thickness of the first organic element layer and a thickness of the second organic element layer might be different from each other.

The thickness of the first organic element layer might be greater than the thickness of the second organic element layer.

The third organic light emitting layer might include a third lower charge transport layer stacked on a third organic element layer, and wherein the thickness of the second organic element layer might be greater than a thickness of the third organic element layer.

The second capping member might include opposed ends, with one end of the second capping member overlapping the upper surface of the second organic light emitting layer, and the other end of the second capping member overlapping the upper surface of the third organic light emitting layer.

The second capping member might include a third capping member and a fourth capping member separated from each other, wherein the third capping member is disposed on the second organic light emitting layer, and the fourth capping member is disposed on the third organic light emitting layer.

The second capping member might include a second capping layer and, wherein the first and second capping layers might be integrated into one layer.

A cross-sectional area of the first exposure area might be larger than a cross-sectional area of the third exposure area.

The cross-sectional area of the first exposure area might be larger than a cross-sectional area of the second exposure area, and the cross-sectional area of the second exposure area might be larger than the cross-sectional area of the third exposure area.

The first, second, and third exposure areas might be disposed in a matrix structure in which the first and second exposure areas are repeatedly disposed in any one column, and the third exposures are repeatedly disposed at a position adjacent to the column in which the first and second exposure areas are repeatedly disposed.

The first capping layer and the second capping member might have different optical refractive indices, and a difference between the optical refractive indices of the first capping layer and the second capping member might be about 0.9 or less.

The second capping member might include a second capping layer, with the first capping layer having a first thickness, and the second capping layer having a second thickness, wherein the first thickness is about 1000 Å or less, and the second thickness is about 400 Å to about 600 Å.

According to one or more exemplary embodiments of the invention, a display device includes a pixel defining layer having first and second exposure areas, each exposing a first electrode; a first lower charge transport layer disposed on the first electrode of the first exposure area and having a first thickness; a second lower charge transport layer disposed on the first electrode of the second exposure area and having a second thickness different from the first thickness; a first organic element layer disposed on the first lower charge transport layer and having a third thickness and an upper surface; a second organic element layer disposed on the second lower charge transport layer and having a fourth thickness different from the third thickness and an upper surface; a second electrode disposed on the first and second organic element layers; a first capping layer disposed on the second electrode and overlapping the upper surfaces of the first and second organic element layers; and a second capping member disposed on the first capping layer, does not overlap the upper surface of the first organic element layer, and overlaps a portion of the second organic element layer.

The first thickness might be greater than the second thickness, and the third thickness might be greater than the fourth thickness.

The display device might further include a third lower charge transport layer disposed on the first electrode of a third exposure area exposing the first electrode and having a fifth thickness different from the first and second thicknesses; and a third organic element layer disposed on the third lower charge transport layer and having a sixth thickness different from the third and fourth thicknesses, wherein the second electrode might be disposed on the third organic element layer, the first capping layer overlaps an upper surface of the third organic element layer, and the second capping member overlaps only a portion of the third organic element layer.

The first thickness might be greater than the second thickness, and the second thickness might be greater than the fifth thickness.

The third thickness might be greater than the fourth thickness, and the fourth thickness might be greater than the sixth thickness.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
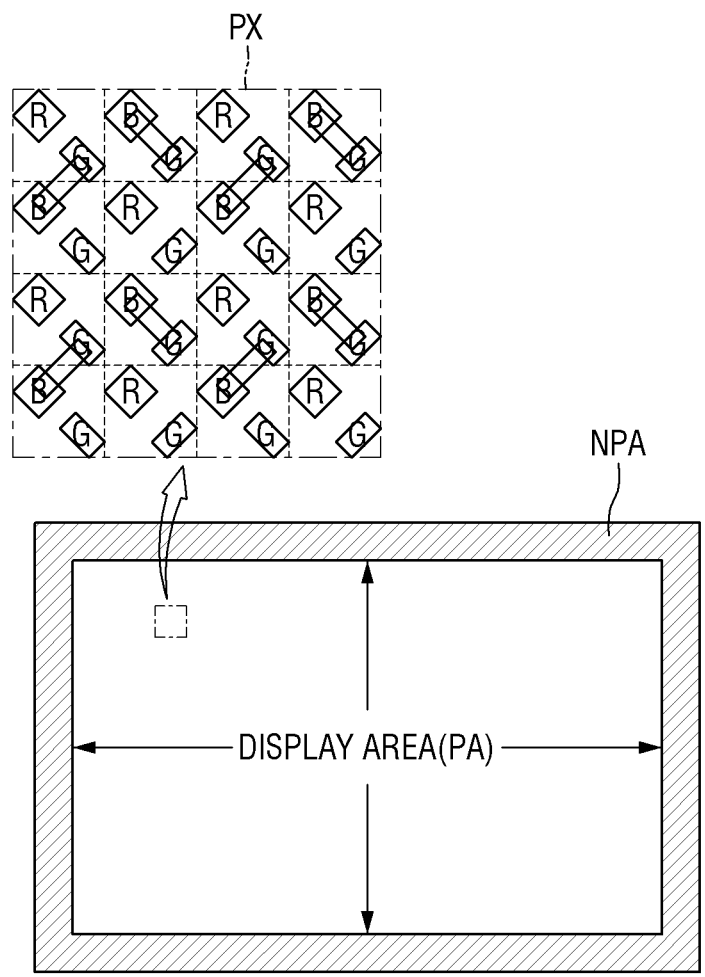
FIG. 1 is a conceptual plan view of a display device constructed according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

In the specification, a light emitting device refers to a device that provides light. Examples of the light emitting device include display devices that display a screen using a lighting device or light, such as an organic light emitting display device, an inorganic light emitting display device, and a plasma display device.

FIG. 1 is a conceptual plan view of a display device 1 constructed according to an exemplary embodiment.

Referring to FIG. 1, the display device 1 may include a display area PA and a non-display area NPA surrounding the display area PA.

The display area PA may include a plurality of pixels PX. The pixels PX may be arranged in a matrix form as illustrated in the drawing. Each pixel PX may display a specific color.

For example, each pixel PX of the display device 1 may have a matrix type of pixel structure in which a red subpixel R and a blue subpixel B may be repeatedly disposed in any one column, and a green subpixel G may be repeatedly disposed at a position adjacent to the column in which the red subpixel R and the blue subpixel B are repeatedly disposed, such as those marketed by the assignee under its Pen Tile® trademark.

The red subpixel R and the green subpixel G adjacent to each other may form one pixel PX, and the blue subpixel B and the green subpixel G adjacent to each other may form one pixel PX. Here, assuming that the red subpixel R and the green subpixel G form a first pixel and the blue subpixel B and the green subpixel G form a second pixel, the first pixel and the second pixel may be alternately arranged in a horizontal line and a vertical line. Therefore, the second pixel may be disposed on upper, lower, left, and right sides of the first pixel formed at a specific position.

While the structure in which the red subpixel R and the green subpixel G form one pixel PX and the blue subpixel B and the green subpixel G adjacent to each other form one pixel PX has been described above, the concepts of a subpixel and a pixel may be relative concepts for distinguishing the subpixel and the pixel from each other for convenience. That is, in some exemplary embodiments, the subpixel and the pixel may be used as different terms referring to the same object.

The display area PA may be formed, for example, in a rectangular shape. However, the display area PA may also be formed in a square, circular, or elliptical shape.

The non-display area NPA may be disposed around the display area PA. The non-display area NPA is an area where no image is displayed. For example, a light blocking member such as a black matrix may be disposed in the non-display area NPA. In some exemplary embodiments, the non-display area NPA may form a bezel part of the display device 1.

Although the non-display area NPA surrounds all sides of the display area PA in the drawing, exemplary embodiments are not limited to this case. In some exemplary embodiments, the non-display area NPA may be disposed only on short sides of the display area PA. In some exemplary embodiments, the non-display area NPA may be disposed only on long sides of the display area PA. Further, the non-display area NPA may be disposed only on any one side of the display area PA.

In the non-display area NPA, various driving elements for driving the pixels PX may be disposed. Pixels PX may also be located in the non-display area NPA, but the pixels PX located in the non-display area NPA may be dummy pixels that are not visible from the outside.

Each pixel PX of the display area PA may include at least one light emitting element. In some exemplary embodiments, each pixel PX may include at least one top-emission light emitting element.

As used herein, the term "single-sided light emission" refers to emitting light mainly through one side from among both sides of a device. In addition, the term "top emission" refers to emitting light mainly through a top side from among the top side and a bottom side. Here, "emitting light mainly through the top side" denotes that the amount of light emitted through the top side is greater than the amount of light emitted through the bottom side. For example, this may be a case where the amount of light emitted through the top side is about 70% or more or about 90% or more of the total amount of light emitted.

For top emission, a single-sided light emitting element may be applied as a light emitting element. The single-sided light emitting element includes not only a case where the element itself emits light through one side but also a case where the element emits light through both sides, but an optical member is suitably provided to allow light to be emitted through only one side. For example, although a top-emission organic light emitting element itself emits light through both sides, it may be made to emit light mainly through the top side by adjusting physical properties, transmittance, reflectance, etc. of electrodes. Therefore, the top-emission organic light emitting element is interpreted as a single-sided light emitting element herein.

An organic light emitting display device in which each pixel PX includes at least one top emission light emitting element will hereinafter be described as an example, but exemplary embodiments according to the technical spirit of the disclosure are not limited to this organic light emitting display device.

Figure 2:
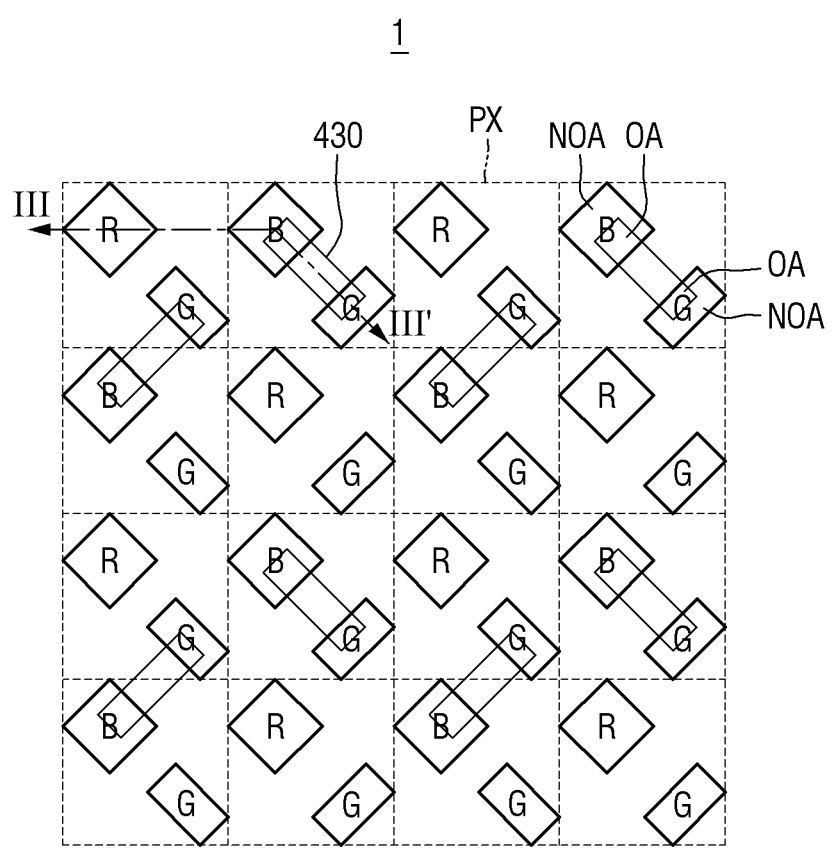
FIG. 2 is an enlarged view of some of the pixels of FIG. 1.
Figure 3:
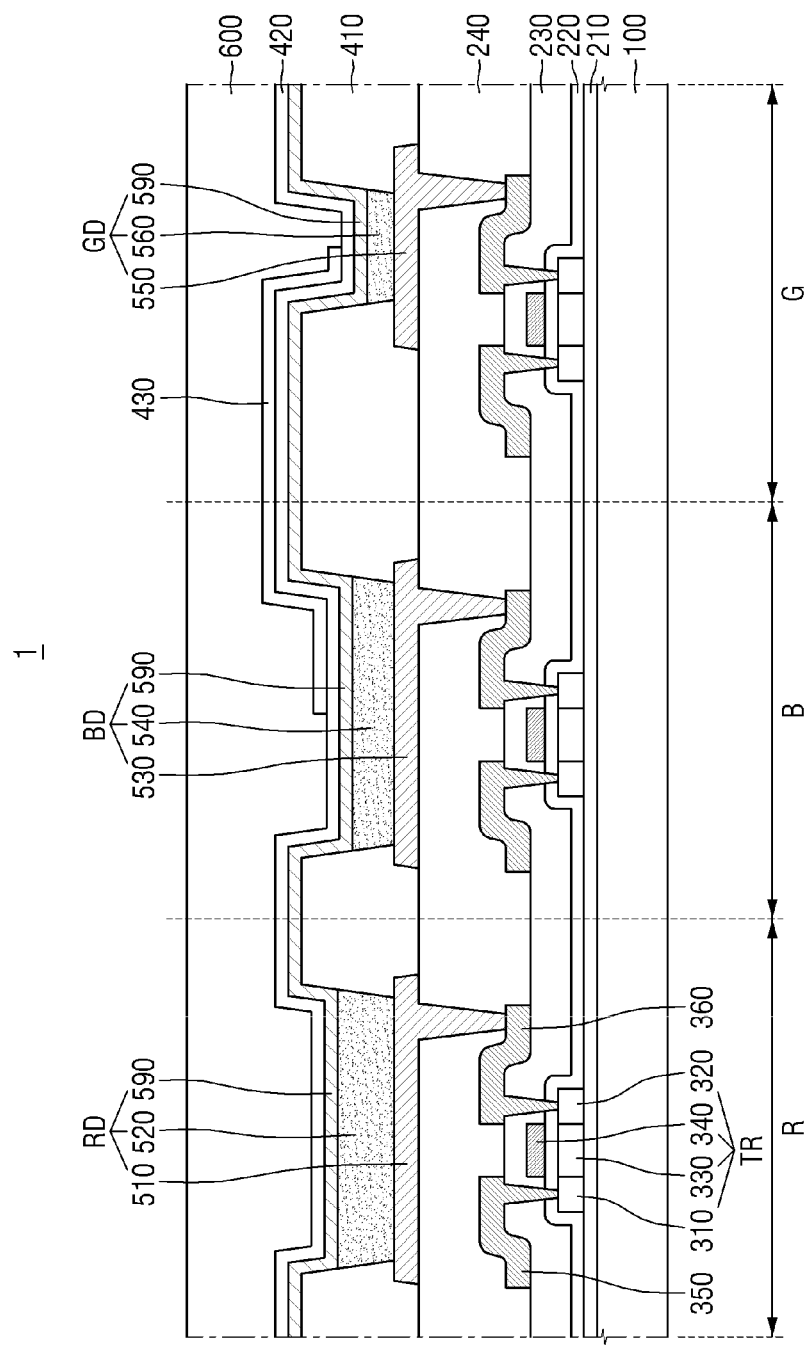
FIG. 3 is a cross-sectional view taken along line of III-III' of FIG. 2.
Figure 4:
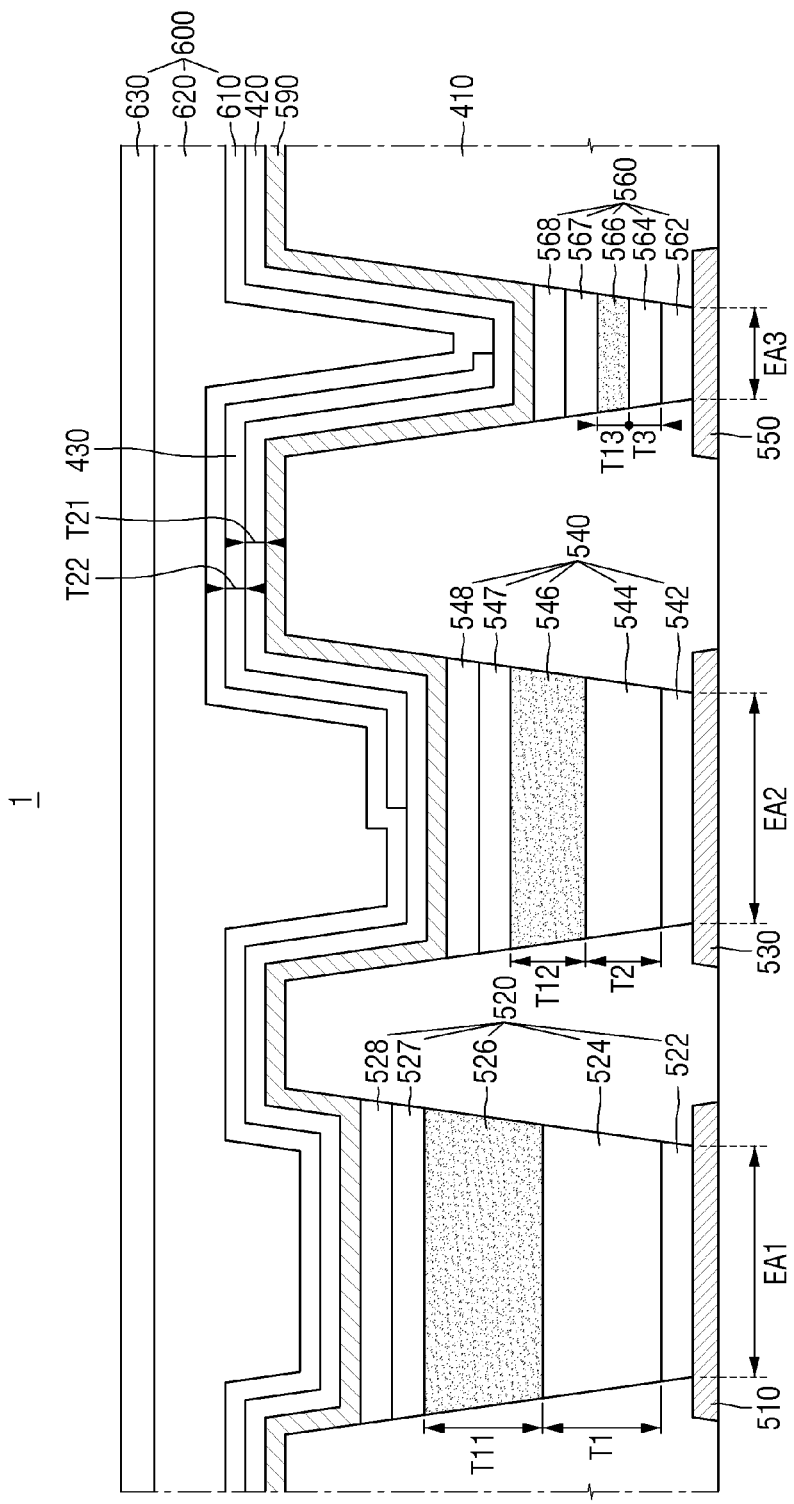
FIG. 4 is an enlarged cross-sectional view of the organic light emitting elements of FIG. 3.

FIG. 2 is an enlarged view of some of the pixels PX of FIG. 1. FIG. 3 is a cross-sectional view taken along line III-III' of FIG. 2. FIG. 4 is an enlarged cross-sectional view of the organic light emitting elements RD, BD and GD of FIG. 3.

First, referring to FIG. 3, a substrate 100 may include an insulating substrate. The insulating substrate may be made of a material such as glass, quartz, or polymer resin. Examples of the polymer material may include polyethersulphone (PES), polyacrylate (PA), polyarylate (PAR), polyetherimide (PEI), polyethylene naphthalate (PEN), polyethylene terepthalate (PET), polyphenylene sulfide (PPS), polyallylate, polyimide (PI), polycarbonate (PC), cellulose triacetate (CAT or TAC), cellulose acetate propionate (CAP), and combinations of these materials. In some exemplary embodiments, the substrate 100 may be a flexible substrate made of a flexible material such as polyimide (PI).

In some exemplary embodiments, the substrate 100 may have a thickness of about 5 micrometers ("μm") to about 200 μm A thickness of about 200 μm or less enables the substrate 100 to maintain flexible characteristics. A thickness of about 5 μm or more enables the substrate 100 to stably support structures disposed on the substrate 100.

A buffer layer 210 may be disposed on the substrate 100. The buffer layer 210 may prevent penetration of impurity elements and may planarize the surface. The buffer layer 210 may be made of any one of, for example, a silicon nitride (SiNx) layer, a silicon oxide ($SiO_2$) layer, and a silicon oxynitride (SiOxNy) layer. However, the buffer layer 210 is optional and may be omitted depending on the type of the substrate 100 and element manufacturing process conditions.

A semiconductor layer (310, 320 and 330) may be disposed on the buffer layer 210. The semiconductor layer (310, 320 and 330) may include any one of a polycrystalline silicon layer (poly Si), an amorphous silicon layer (amorphous Si), and an oxide semiconductor such as indium-gallium-zinc oxide (IGZO) or indium zinc tin oxide (IZTO). For example, when the semiconductor layer (310, 320 and 330) includes a polycrystalline silicon layer, it may include a channel region 330 which is not doped with impurities and a source region 310 and a drain region 320 which are formed on both sides of the channel region 330 and doped with impurities.

The type of impurities used to dope the source region 310 and the drain region 320 may vary depending on the type of a thin-film transistor TR. In some exemplary embodiments, a P-type transistor having the source region 310 and the drain region 320 doped with P-type impurities may be used as the thin-film transistor TR.

A gate insulating layer 220 may be disposed between the semiconductor layer (310, 320 and 330) and a gate electrode 340. The gate insulating layer 220 may include an insulating layer. For example, the gate insulating layer 220 may include at least one of silicon nitride (SiNx) and silicon oxide ($SiO_2$). In some exemplary embodiments, the gate insulating layer 220 may be formed as a multilayer structure such as a double layer, instead of a single layer.

The gate electrode 340 may be disposed on the gate insulating layer 220. The gate electrode 340 may extend in a direction to be connected to a gate wiring. The gate electrode 340 may overlap the channel region 330. The gate electrode 340 may include at least one of, for example, molybdenum (Mo), chromium (Cr), and tungsten (W). In addition, although not illustrated in detail, a first electrode of a capacitor for driving the organic light emitting elements RD, BD and GD may be disposed on the gate insulating layer 220.

An interlayer insulating film 230 may be disposed on the gate electrode 340. The interlayer insulating film 230 may completely cover the gate electrode 340 to insulate the gate electrode 340. Like the gate insulating layer 220, the interlayer insulating film 230 may include, but is not limited to, silicon nitride (SiNx), silicon oxide (SiOx), or tetraethoxysilane (TEOS).

A data wiring including a source electrode 350 and a drain electrode 360 may be disposed on the interlayer insulating film 230. Although not illustrated in detail, a second electrode of the capacitor for driving the organic light emitting elements RD, BD and GD may be disposed on the interlayer insulating film 230.

The source electrode 350 and the drain electrode 360 may be connected to the source region 310 and the drain region 320 through via holes formed in the gate insulating layer 220 and the interlayer insulating film 230, respectively. The drain electrode 360 may be connected to each of pixel electrodes 510, 530 and 550 of the organic light emitting elements RD, BD and GD through a via formed in a planarization layer 240.

The thin-film transistor TR may provide a driving signal to each of the pixel electrodes 510, 530 and 550 so as to cause organic light emitting layers 520, 540 and 560 of the organic light emitting elements RD, BD and GD defining the pixels PX (see FIG. 2) or the subpixels R, B and G (see FIG. 2) to emit light.

Specifically, a voltage corresponding to a difference between a data voltage provided from a data line and a common voltage provided from a common power supply line is stored in the capacitor, and a driving current corresponding to the voltage stored in the capacitor flows to the organic light emitting element RD, BD or GD through the thin-film transistor TR. As a result, the organic light emitting element RD, BD or GD may emit light. Other thin-film transistors (for example, a selection transistor) and various wirings for driving the organic light emitting elements RD, BD and GD may be additionally disposed in the interlayer insulating film 230 and the planarization layer 240.

The planarization layer 240 may be disposed on the interlayer insulating film 230 to cover the source electrode 350 and the drain electrode 360. The planarization layer 240 may remove a step and planarize the surface in order to increase the luminous efficiency of the organic light emitting elements RD, BD and GD disposed on the planarization layer 240. The planarization layer 240 may include one or more of, for example, polyacrylates resin, epoxy resin, phenolic resin, polyamides resin, polyimides resin, unsaturated polyesters resin, polyphenylenethers resin, polyphenylenesulfides resin, and benzocyclobutene (BCB).

Referring to FIGS. 3 and 4, the pixel electrodes 510, 530 and 550 of the organic light emitting elements RD, BD and GD may be disposed on the planarization layer 240 separated from each other. Each of the pixel electrodes 510, 530, and 550 may be electrically connected to the drain electrode 360 through the via formed in the planarization layer 240.

The pixel electrodes 510, 530, and 550 may include a conductive material having a relatively high work function compared with a common electrode 590. For example, the pixel electrodes 510, 530 and 550 may include indium-tin-oxide (ITO), indium-zinc-oxide (IZO), zinc oxide (ZnO), or indium oxide ($In_2O_3$). In addition to the conductive material, the pixel electrodes 510, 530 and 550 may further include a reflective material such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a mixture of these materials. Therefore, the pixel electrodes 510, 530 and 550 may have a single layer structure formed of the conductive material and the reflective material or a multilayer structure formed by stacking the conductive material and the reflective material. When the pixel electrodes 510, 530 and 550 have a multilayer structure, uppermost layers respectively adjacent to the organic light emitting layers 520, 540 and 560 may be made of a conductive material having a high work function. For example, the pixel electrodes 510, 530 and 550 may have a multilayer structure of ITO/Mg, ITO/MgF, ITO/Ag, or ITO/Ag/ITO.

A pixel defining layer 410 may be disposed to partially expose the pixel electrodes 510, 530 and 550. The pixel defining layer 410 may define the pixels PX (see FIG. 2) or the subpixels R, B and G (see FIG. 2), specifically, may define barriers of the pixels PX (see FIG. 2) or the subpixels R, B and G (see FIG. 2). The pixel electrodes 510, 530 and 550 may be disposed to correspond to the pixels PX (see FIG. 2) or the subpixels R, B and G (see FIG. 2) by the pixel defining layer 410.

Specifically, the pixel defining layer 410 may include a first exposure area EA1 which exposes at least part of the first pixel electrode 510, and the first exposure area EA1 may correspond to the red subpixel R (see FIG. 2). In addition, the pixel defining layer 410 may include a second exposure area EA2 which exposes at least part of the second pixel electrode 530, and the second exposure area EA2 may correspond to the blue subpixel B (see FIG. 2). The pixel defining layer 410 may also include a third exposure area EA3 which exposes at least part of the third pixel electrode 550, and the third exposure area EA3 may correspond to the green subpixel G (see FIG. 2).

In some exemplary embodiments, the cross-sectional area of the first pixel electrode 510 exposed by the first exposure area EA1 (hereinafter, referred to as the cross-sectional area of the first exposure area EA1) may be different from the cross-sectional area of the third pixel electrode 550 exposed by the third exposure area EA3 (hereinafter, referred to as the cross-sectional area of the third exposure area EA3). Specifically, the cross-sectional area of the first exposure area EA1 may be larger than the cross-sectional area of the third exposure area EA3.

In addition, in some exemplary embodiments, the cross-sectional area of the second pixel electrode 530 exposed by the second exposure area EA2 (hereinafter, referred to as the cross-sectional area of the second exposure area EA2) may be different from the cross-sectional area of the third exposure area EA3. Specifically, the cross-sectional area of the second exposure area EA2 may be larger than the cross-sectional area of the third exposure area EA3.

In addition, in some exemplary embodiments, the cross-sectional area of the first exposure area EA1 and the cross-sectional area of the second exposure area EA2 may be substantially the same.

The pixel defining layer 410 may include, for example, resins such as polyacrylates resin and polyimides resin.

The first, second and third organic light emitting layers 520, 540 and 560 may be disposed in the first, second and third exposure areas EA1, EA2 and EA3, respectively.

Specifically, the first organic light emitting layer 520 may be disposed on the first pixel electrode 510 exposed by the first exposure area EA1, the second organic light emitting layer 540 may be disposed on the second pixel electrode 530 exposed by the second exposure area EA2, and the third organic light emitting layer 560 may be disposed on the third pixel electrode 550 exposed by the third exposure area EA3.

The first organic light emitting layer 520 may correspond to the red subpixel R (see FIG. 2) and emit red light. The second organic light emitting layer 540 may correspond to the blue subpixel B (see FIG. 2) and emit blue light. The third organic light emitting layer 560 may correspond to the green subpixel G (see FIG. 2) and emit green light.

However, exemplary embodiments are not limited to the above case. In some exemplary embodiments, the first, second and third organic light emitting layers 520, 540 and 560 may each emit white light, and R, B and G color filters may be disposed on the first, second and third organic light emitting layers 520, 540 and 560 in respective pixels or subpixels to provide red light, blue light and green light, respectively.

In some exemplary embodiments, the first, second and third organic light emitting layers 520, 540 and 560 may emit blue light, and wavelength conversion layers may be disposed on the first, second and third organic light emitting layers 520, 540 and 560 in respective pixels or subpixels to provide red light, blue light and green light, respectively.

The first organic light emitting layer 520 may include a first lower charge injection layer 522, a first lower charge transport layer 524, a first organic element layer 526, a first upper charge transport layer 527, and a first upper charge injection layer 528 stacked sequentially.

The first lower charge injection layer 522 and the first lower charge transport layer 524 may each be a single layer made of a single material or a single layer made of a plurality of different materials, or may have a multilayer structure having a plurality of layers made of a plurality of different materials. The first organic light emitting layer 520 may further include a buffer layer and a first charge blocking layer, if necessary.

In addition, although the first organic light emitting layer 520 includes the first lower charge injection layer 522 and the first lower charge transport layer 524 in the drawing, any one of the first lower charge injection layer 522 and the first lower charge transport layer 524 may be optional, or the first lower charge injection layer 522 and the first lower charge transport layer 524 may be integrated into a single layer.

The first lower charge injection layer 522 may enhance the efficiency of hole injection from the first pixel electrode 510 into the first organic element layer 526. Specifically, the first lower charge injection layer 522 may lower an energy barrier to allow holes to be more effectively injected into the first organic element layer 526.

The first lower charge injection layer 522 may include a phthalocyanine compound such as copper phthalocyanine (CuPu), 4,4',4"-tris(N-3-methylphenyl-N-phenylamino)triphenylamine (m-MTDATA), 4,4',4"-tris(diphenylamino)triphenylamine (TDATA), 4,4',4"-tris[2-naphthyl(phenyl)-amino]triphenyl-amine (2-TNATA), polyaniline/dodecylbenzenesulfonic acid (PANI/DBSA), poly(3,4-ethylene dioxythiophene)/polystyrene sulfonate (PEDOT/PSS), polyaniline/camphorsulfonic acid (PANI/CSA), or polyaniline/polystyrene sulfonate (PANI/PSS).

The first lower charge transport layer 524 may be disposed on the first lower charge injection layer 522 and transport the holes injected into the first lower charge injection layer 522 to the first organic element layer 526. The first lower charge transport layer 524 may have optimum hole transport efficiency when its highest occupied molecular energy (HOMO) is substantially lower than the work function of the material that forms the first pixel electrode 510 and is substantially higher than the HOMO of the first organic element layer 526. The first lower charge transport layer 524 may include, for example, 4,4'-bis[N-(1-napthyl)-N-phenyl-amino] biphenyl (NPD), N,N'-diphenyl-N,N'-bis[3-methylphenyl]-1,1'-biphenyl-4,4'-diamine (TPD), 2,2',7,7'-tetrakis-(N,N-diphenylamino)-9,9'-spirobifluoren (s-TAD), or 4,4',4"-tris(N-3-methylphenyl-N-phenylamino) triphenylamine (m-MTDATA).

In addition to the above-mentioned materials, the first lower charge injection layer 522 and the first lower charge transport layer 524 may further include a charge generating material in order to improve conductivity. The charge generating material may be uniformly or non-uniformly dispersed in the first lower charge injection layer 522 and the first lower charge transport layer 524. The charge generating material may be, for example, a p-dopant. The p-dopant may be, for example, one of a quinone derivative, a metal oxide, and a compound containing a cyano group. Non-limiting examples of the p-dopant include quinone derivatives such as tetracyanoquinodimethane (TCNQ) and 2,3,4,6-tetrafluoro-tetracyanoquinodimethane (F4-TCNQ) and metal oxides such as tungsten oxide and molybdenum oxide.

As mentioned above, the first organic light emitting layer 520 may further include at least one of a buffer layer and a first charge blocking layer. The buffer layer may compensate for a resonance distance of light emitted from the first organic element layer 526 depending on the wavelength of the light, thereby improving the efficiency of the emission of the light. The buffer layer may include a material that may be contained in the first lower charge injection layer 522 and the first lower charge transport layer 524. The first charge blocking layer may prevent the injection of charges from the first upper charge injection layer 528 and the first upper charge transport layer 527 into the first lower charge injection layer 522 and the first lower charge transport layer 524.

The first organic element layer 526 may be disposed on the first lower charge injection layer 522 and the first lower charge transport layer 524. The first organic element layer 526 may be made of any material that is typically used in a light emitting layer. For example, the first organic element layer 526 may be made of a material that emits red light. The first organic element layer 526 may include a fluorescent material or a phosphorescent material.

In an exemplary embodiment, the first organic element layer 526 may include a host and a dopant.

As the host, for example, tris-(8-hydroyquinolato)aluminum(III) (Alq3), N,N'-dicarbazole-biphenyl (CBP), poly(N-vinylcarbazole) (PVK), 9,10-bis(2-naphthalenyl)anthracene (ADN), 4,4',4"-tris(Ncarbazolyl)triphenylamine (TCTA), 1,3,5-tris(N-phenylbenzimiazole-2-yl)benzene (TPBi), 2-(t-butyl)-9,10-bis(20-naphthyl)anthracene (TBRDN), distyrylarylene (DSA), 4,4'-bis(9-carbazolyl)-2,2'-dimethyl-biphenyl (CDBP), or 2-methyl-9,10-bis(naphthalen-2-yl) anthracene (MADN) may be used.

As the dopant, both a fluorescent dopant and a known phosphorescent dopant may be used. The first organic element layer 526 may include a red dopant.

As the red dopant, for example, a fluorescent material including 2-biphenyl-4-yl-5-(4-t-butylphenyl)-1,3,4-oxadiazole:tris(dibenzoylmethane) mono(1,10-phenanthroline) europium(lll)) (PBD:Eu(DBM)3(Phen)) or perylene may be selected. Alternatively, a phosphorescent material including a metal complex, such as bis(1-phenylquinoline)acetylacetonate iridium (PlQlr(acac)), bis(1-phenylquinoline)acetylacetonate iridium (PQlr(acac)), tris(1-phenylquinoline) iridium (PQlr) or octaethylporphyrin platinum (PtOEP), or an organometallic complex may be selected as the red dopant.

The first upper charge transport layer 527 and the first upper charge injection layer 528 may be disposed on the first organic element layer 526.

The first upper charge transport layer 527 and the first upper charge injection layer 528 may each be a single layer made of a single material or a single layer made of a plurality of different materials, or may have a multilayer structure having a plurality of layers made of a plurality of different materials. In addition, the first upper charge transport layer 527 and the first upper charge injection layer 528 may further include a second charge blocking layer, if necessary. Although the first upper charge transport layer 527 and the first upper charge injection layer 528 are illustrated in the drawing, any one of the first upper charge transport layer 527 and the first upper charge injection layer 528 may be optional, or the first upper charge transport layer 527 and the first upper charge injection layer 528 may be integrated into a single layer.

The first upper charge injection layer 528 is disposed on the first upper charge transport layer 527 and enhances the efficiency of electron injection from the common electrode 590 into the first organic element layer 526.

The first upper charge injection layer 528 may be made of, but not limited to, a lanthanide metal such as LiF, lithium quinolate (LiQ), $Li_2O$, BaO, NaCl, CsF or Yb or may be made of a halide metal such as RbCl or RbI.

The first upper charge injection layer 528 may also be made of a mixture of the lanthanide metal or the halide metal and an insulating organo metal salt. The organo metal salt may be a material having an energy band gap of about 4 eV or higher. For example, the organo metal salt may include metal acetate, metal benzoate, metal acetoacetate, metal acetylacetonate or metal stearate.

The first upper charge transport layer 527 may include, but is not limited to, tris-(8-hydroxyquinolato)aluminum(III) (Alq3), 1,3,5-tris(N-phenylbenzimiazole-2-yl)benzene (TPBi), 2,9-dimethyl-4,7-diphenyl-1,10-phenanthroline (BCP), 4,7-diphenyl-1,10-phenanthroline (Bphen), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ), 2-(4-biphenylyl)-5-(4-tert-butyl-phenyl)-1,3,4-oxadiazole (tBu-PBD), bis(2-methyl-8-quinolinolato-N1,O8)-(1,1'-biphenyl-4-olato)aluminum (BAlq), bis(10-hydroxybenzo[h]quinolinato)beryllium (Bebq2), 9,10-bis(2-naphthyl)anthracene (ADN), or a mixture of these materials.

The first upper charge transport layer 527 and the first upper charge injection layer 528 may further include a second charge blocking layer. The second charge blocking layer may include at least one of, for example, 2,9-dimethyl-4,7-diphenyl-1,10-phenanthroline (BCP) and 4,7-diphenyl-1,10-phenanthroline (Bphen).

The second organic light emitting layer 540 may include a second lower charge injection layer 542, a second lower charge transport layer 544, a second organic element layer 546, a second upper charge transport layer 547, and a second upper charge injection layer 548 stacked sequentially. Here, the layers excluding the second organic element layer 546 may be the same as those of the first organic light emitting layer 520 and thus will not be described in detail.

The second organic element layer 546 may include a blue dopant. As the blue dopant, for example, a fluorescent material including any one of spiro-4,'-bis(2,2'-diphenylvinyl)1,1'-biphenyl (spiro-DPVBi), spiro-sixphenyl (spiro-6P), distyrylbenzene (DSB), distyrylarylene (DSA), a polyfluorene (PFO)-based polymer, and a poly p-phenylene vinylene (PPV)-based polymer may be selected. Alternatively, a phosphorescent material such as bis[2-(4,6-difluorophenyl)pyridinato-N,C2']iridium picolinate (F2Irpic), bis[2-(4,6-difluorophenyl)pyridinato-N,C2']iridium 2,2,6,6-tetramethylheptane-3,5-dione ((F2ppy)2lr(tmd)), or tris[1-(4,6-difluorophenyl)pyrazolate-N,C2']iridium (Ir(dfppz)3 may be selected as the blue dopant.

The third organic light emitting layer 560 may include a third lower charge injection layer 562, a third lower charge transport layer 564, a third organic element layer 566, a third upper charge transport layer 567, and a third upper charge injection layer 568 stacked sequentially. Likewise, the layers excluding the third organic element layer 566 may be the same as those of the first organic light emitting layer 520 and thus will not be described in detail.

The third organic element layer 566 may include a green dopant. As the green dopant, for example, a fluorescent material including tris-(8-hydroxyquinolato) aluminum(III) (Alq3) may be selected. Alternatively, a phosphorescent material such as fac tris(2-phenylpyridine)iridium (Ir(ppy)3), bis(2-phenylpyridine)(acetylacetonate)iridium(III) (Ir(ppy)2(acac)), or 2-phenyl-4-methyl-pyridine iridium (Ir(mpyp)3) may be selected as the green dopant.

In some exemplary embodiments, the organic light emitting layers 520, 540 and 560 may employ a resonance structure to increase the resonance efficiency of top emission. Here, the term "top emission" may denote that light is mainly emitted from the organic light emitting layers 520, 540 and 560 toward the common electrode 590.

Specifically, in order to increase the resonance efficiency of top emission, a thickness T1 of the first lower charge transport layer 524, a thickness T2 of the second lower charge transport layer 544, and a thickness T3 of the third lower charge transport layer 564 may be made different from each other. Specifically, the thickness T1 of the first lower charge transport layer 524 may be greater than the thickness T2 of the second lower charge transport layer 544, and the thickness T2 of the second lower charge transport layer 544 may be greater than the thickness T3 of the third lower charge transport layer 564.

In addition, in order to increase the resonance efficiency of top emission, a thickness T11 of the first organic element layer 526, a thickness T12 of the second organic element layer 546, and a thickness T13 of the third organic element layer 566 may be made different from each other. Specifically, the thickness T11 of the first organic element layer 526 may be greater than the thickness T12 of the second organic element layer 546, and the thickness T12 of the second organic element layer 546 may be greater than the thickness T13 of the third organic element layer 566.

The common electrode 590 may be disposed on the organic light emitting layers 520, 540 and 560. The common electrode 590 may be, for example, a front electrode formed without distinction between pixels.

In some exemplary embodiments, the pixel electrodes 510, 530 and 530 may be formed as reflective electrodes, and the common electrode 590 may be formed as a transmissive electrode or a transflective electrode. Accordingly, light generated by the organic light emitting layers 520, 540 and 560 may be provided toward the common electrode 590.

The common electrode 590 may include a conductive material having a relatively low work function compared with the pixel electrodes 510, 530 and 550. For example, the common electrode 590 may include any of Li, Ca, LiF/Ca, LiF/Al, Al, Mg, Ag, Pt, Pd, Ni, Au Nd, Ir, Cr, BaF, Ba, or a compound or mixture of these materials (e.g., a mixture of Ag and Mg). The conductive material may be provided as a thin layer, and a transparent metal oxide such as indiumtin-oxide (ITO), indium-zinc-oxide (IZO), zinc oxide (ZnO), or indium-tin-zinc-oxide may be stacked on the conductive material.

When a first voltage is applied to the pixel electrodes 510, 530 and 550 and a second voltage lower than the first voltage is applied to the common electrode 590, an electric current flows from the pixel electrodes 510, 530 and 550 toward the common electrode 590. As a result, the organic light emitting layers 520, 540 and 560 emit light. Specifically, holes are injected from the pixel electrodes 510, 530 and 550 into the lower charge injection layers 522, 542 and 562 and transported through the lower charge transport layers 524, 544 and 564 to reach the organic light emitting layers 520, 540 and 560. In addition, electrons are injected from the common electrode 590 into the upper charge injection layers 528, 548 and 568 and transported through the upper charge transport layers 527, 547 and 567 to reach the organic light emitting layers 520, 540 and 560. When the holes and the electrons meet and combine in the organic light emitting layers 520, 540 and 560, light emitting materials of the organic light emitting layers 520, 540 and 560 are excited by the energy of the combination. The organic light emitting layers 520, 540 and 560 emit light as they return from the excited state to a ground state. The amount of light emitted from the organic light emitting layers 520, 540 and 560 varies according to the amount of current flowing through the organic light emitting layers 520, 540 and 560.

The light emitted from the organic light emitting layers 520, 540 and 560 may travel in random directions. Basically, light may be directed toward the bottom side (toward the substrate 100), toward the top side (toward an encapsulation layer 600), and toward the sides. The light directed toward the bottom side may be reflected to the top side by the pixel electrodes 510, 530 and 550. The light directed toward the top side may be emitted through the common electrode 590. A conductive material having a low work function contained in the common electrode 590 cannot transmit light by itself. However, when formed as a thin layer, the conductive material can transmit a large amount of incident light.

In order to increase the resonance efficiency of top emission described above, a first capping layer 420 may be disposed on the common electrode 590. Specifically, the above-described structure of the organic light emitting layers 520, 540, and 560 and the first capping layer 420 may increase the efficiency of top emission using, for example, a resonance phenomenon due to reinforced interference of light.

The first capping layer 420 may be disposed on the common electrode 590. Specifically, the first capping layer 420 may be disposed on the common electrode 590 to overlap upper surfaces of the first, second and third organic light emitting layers 520, 540 and 560.

The first capping layer 420 may include at least one of, for example, a silicon nitride (SiNx) layer, a silicon oxide ($SiO_2$) layer, and a silicon oxynitride (SiOxNy) layer.

A second capping layer 430 may be disposed on the first capping layer 420. The second capping layer 430 may not be disposed on the first organic light emitting layer 520 but may be disposed only on the second organic light emitting layer 540 and the third organic light emitting layer 560 as illustrated in the drawings. In other words, the second capping layer 430 may not overlap the upper surface of the first organic light emitting layer 520 and may only partially overlap the upper surface of the second organic light emitting layer 540 and the upper surface of the third organic light emitting layer 560. Accordingly, each of the upper surfaces of the second organic light emitting layer 540 and the third organic light emitting layer 560 may include a non-overlap area NOA (see FIG. 2) which is not overlapped by the second capping layer 430 and an overlap area OA (see FIG. 2) which is overlapped by the second capping layer 430.

In some exemplary embodiments, an end of the second capping layer 430 may overlap the upper surface of the second organic light emitting layer 540, and the other end of the second capping layer 430 may overlap the upper surface of the third organic light emitting layer 560. The second capping layer 430 may reduce white angular dependency (WAD) phenomenon of the display device 1. This will be described in detail later.

In some exemplary embodiments, a thickness T21 of the first capping layer 420 and a thickness T22 of the second capping layer 430 may be different from each other. For example, the thickness T22 of the second capping layer 430 may be greater than the thickness T21 of the first capping layer 420.

In some exemplary embodiments, the thickness T21 of the first capping layer 420 may be about 1000 Å or less, which is sufficient to ensure mass productivity while maintaining a top emission resonance structure. In some exemplary embodiments, the sum of the thickness T21 of the first capping layer 420 and the thickness T22 of the second capping layer 430 may be about 1000 Å or less, which is sufficient to ensure mass productivity while maintaining the top emission resonance structure. The thickness T22 of the second capping layer 430 may be about 400 Å to about 600 Å in order to minimize the WAD phenomenon.

In some exemplary embodiments, the second capping layer 430 may be formed on the first capping layer 420 using, for example, a fine metal mask (FMM).

In some exemplary embodiments, the second capping layer 430 may include a material different from that of the first capping layer 420. In this case, the second capping layer 430 and the first capping layer 420 may have different optical refractive indices. In some exemplary embodiments, a difference between the optical refractive indices of the second capping layer 430 and the first capping layer 420 may be designed to be about 0.9 or less in order to minimize the WAD phenomenon.

In some exemplary embodiments, the second capping layer 430 may include the same material as the first capping layer 420. In this case, there may be no difference in optical refractive index between the second capping layer 430 and the first capping layer 420 (that is, the difference in optical refractive index is zero). In this case, the first capping layer 420 and the second capping layer 430 may be formed as separate elements as illustrated in the drawings. However, the first capping layer 420 and the second capping layer 430 may also be formed as one body instead of separate elements. An exemplary embodiment related to this will be described later with reference to FIG. 13.

The encapsulation layer 600 may be disposed on the first capping layer 420 and the second capping layer 430. The encapsulation layer 600 may cover the organic light emitting elements RD, BD and GD and the second capping layer 430 to protect the organic light emitting elements RD, BD and GD from external moisture. The encapsulation layer 600 may be a single inorganic layer or a multilayer structure including inorganic layers or may be a layer formed by alternately stacking an inorganic layer and an organic layer.

In some exemplary embodiments, the encapsulation layer 600 may include inorganic layers 610 and 630 and an organic layer 620. In some exemplary embodiments, the encapsulation layer 600 may have a structure in which the inorganic layers 610 and 630 and the organic layer 620 are alternately stacked. In addition, more inorganic layers and organic layers than those illustrated may also be stacked.

The lower inorganic layer 610 may be disposed closest to the organic light emitting element (RD, BD and GD).

The lower inorganic layer 610 may include one or more inorganic materials selected from $Al_2O_3$, $TiO_2$, ZrO, $SiO_2$, AlON, AlN, SiON, $Si_3N_4$, ZnO, and $Ta_2O_5$. The lower inorganic layer 610 may be formed by, for example, chemical vapor deposition (CVD) or atomic layer deposition (ALD). Accordingly, the lower inorganic layer 610 may be conformally disposed along the shapes of the first and second capping layers 420 and 430 as illustrated in the drawings. The upper inorganic layer 630 may include substantially the same material as the lower inorganic layer 610.

The organic layer 620 may include a polymer-based material. Here, examples of the polymer-based material may include polyacrylates resin, epoxy resin, polyimide, and polyethylene. The organic layer 620 may be formed by a thermal deposition process. Here, the thermal deposition process for forming the organic layer 620 may be performed within a temperature range that does not damage the organic light emitting elements RD, BD and GD. The densely formed inorganic layers 610 and 630 may mainly play the role of suppressing the penetration of moisture or oxygen.

In addition, a touch member may be disposed between the encapsulation layer 600. The touch member may obtain position information of an input point using a capacitive method, a resistive method, an electromagnetic induction method, an infrared method, or the like. A window may be disposed on the touch member. The window may cover and protect the touch member and elements disposed under the touch member.

The effect of reducing the WAD phenomenon of the display device 1 will now be described with reference to FIG. 5.

Figure 5:
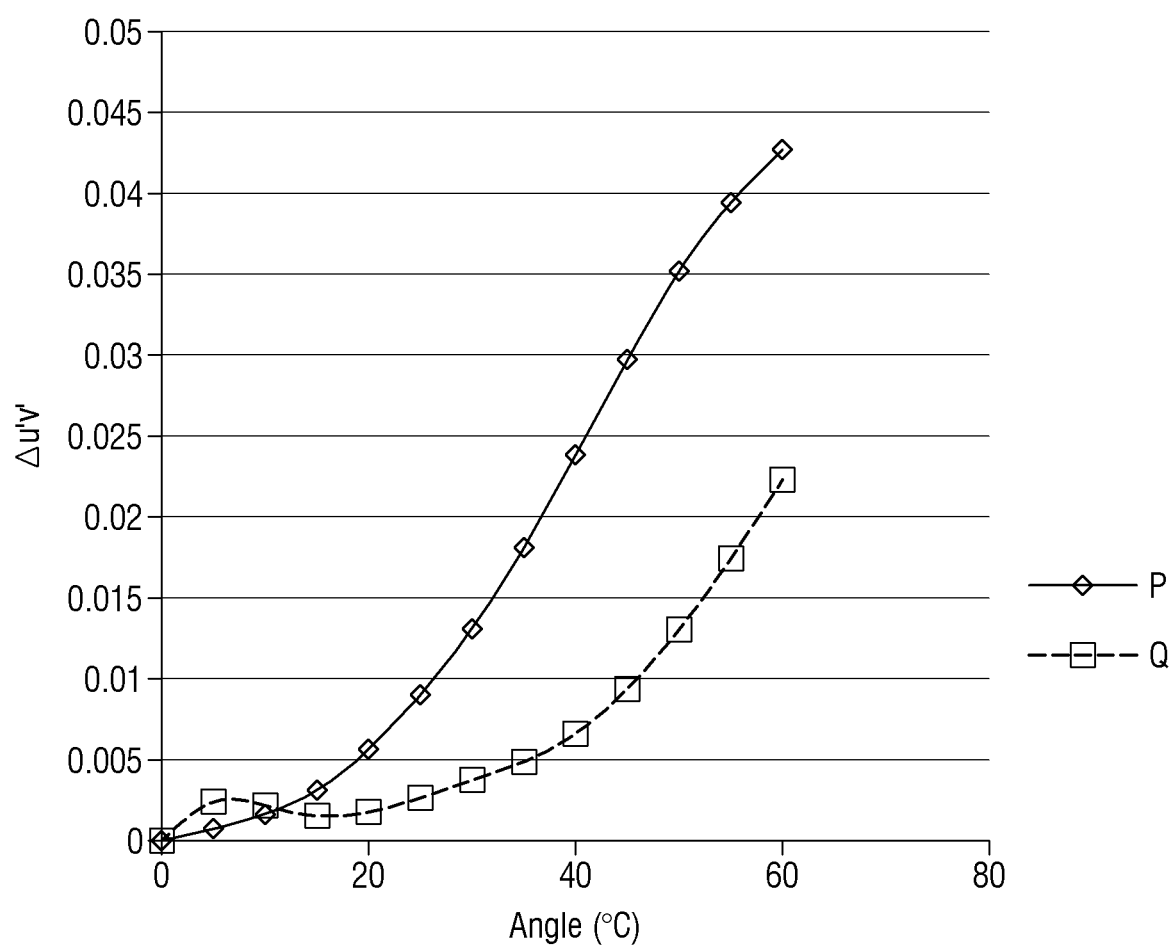
FIG. 5 illustrates the change in white color with respect to the viewing angle of the display device according to comparative and exemplary embodiments.

FIG. 5 illustrates the change in white color with respect to the viewing angle of the display device 1 according to comparative and exemplary embodiments.

More specifically, FIG. 5 illustrates the experimental results of observing a change in white color with respect to the viewing angle, for the display device 1 (indicated by 'Q' in FIG. 5) described above and a display device P of a comparative example, which, unlike the display device Q, does not have the second capping layer 430 (see FIG. 4). In the experiment, a first capping layer 420 (see FIG. 4) having a thickness of about 420 Å and a second capping layer 430 (see FIG. 4) having a thickness of about 520 Å were used.

Referring to FIG. 5, the change in white color with respect to the viewing angle is reduced (see Q) when the second capping layer 430 (see FIG. 4) is introduced. In other words, it can be seen that the WAD phenomenon is reduced.

Such an improvement effect can be explained by an increase in resonance efficiency or a light scattering effect due to the introduction of the second capping layer 430 (see FIG. 4). This will now be described in more detail with reference to FIGS. 6 through 9.

Figure 6:
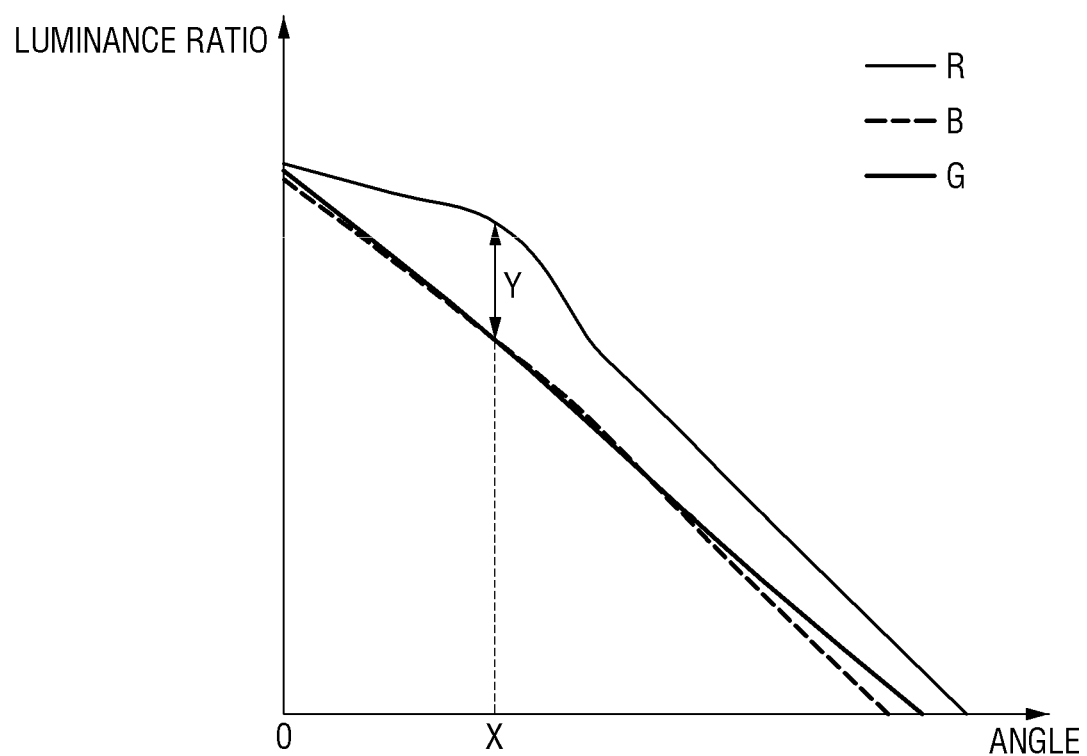
FIGS. 6, 7, and 9 are graphs of luminance ratio vs. viewing angle
Figure 7:
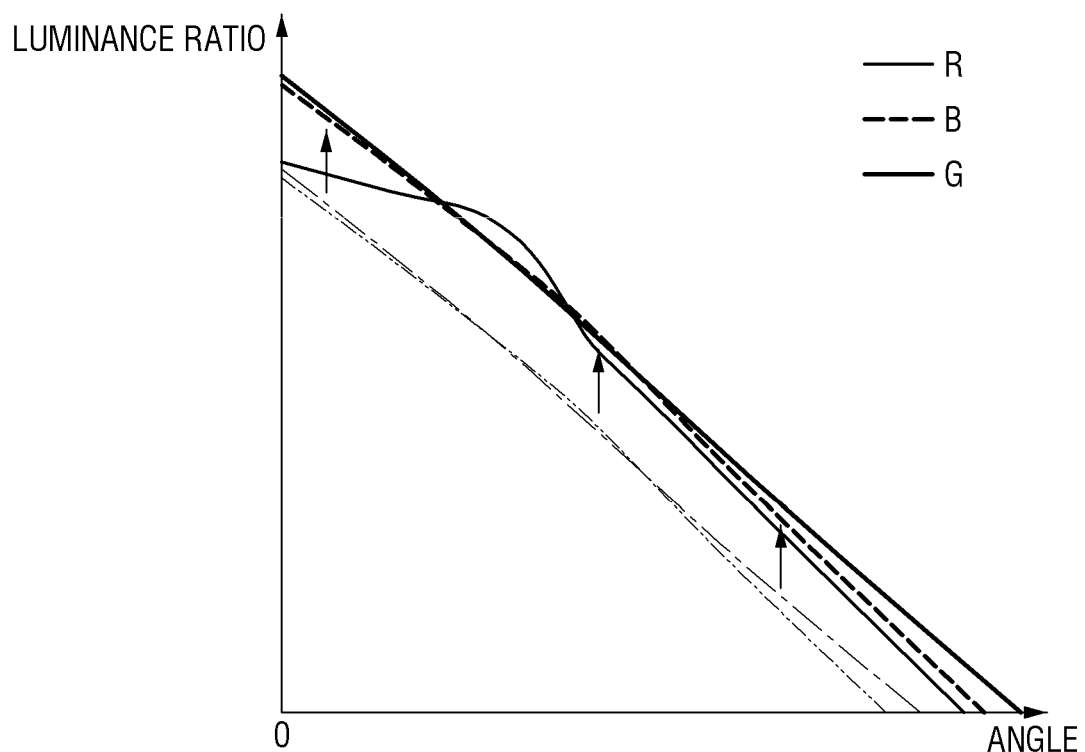
Figure 8:
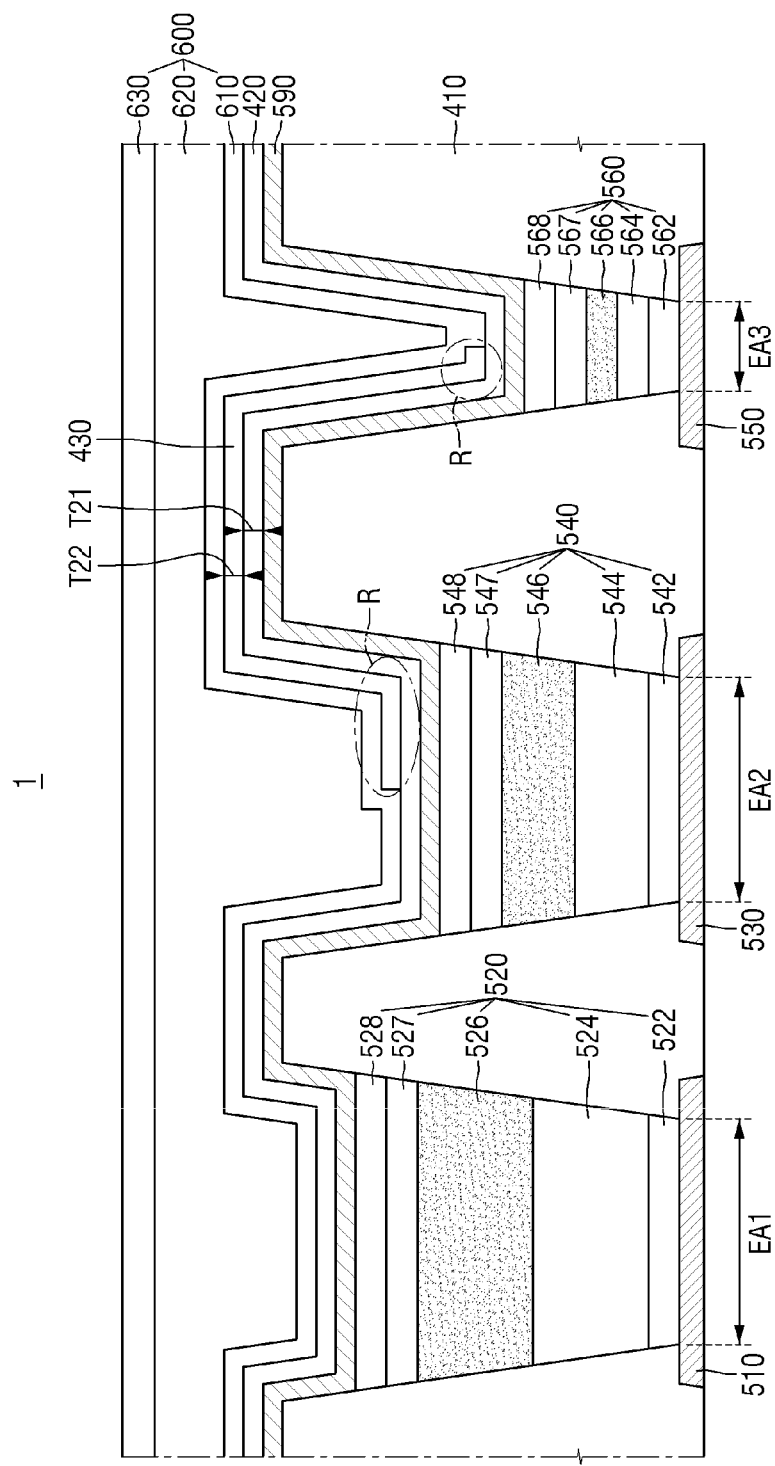
FIG. 8 is an enlarged cross-sectional view of the organic light emitting elements similar to FIG. 3 for explaining the effect of the display device according to the exemplary embodiments.

FIGS. 6, 7, 8, and 9 are graphs of luminance ratio vs. viewing angle and FIG. 8 is an enlarged cross-sectional view of the organic light emitting elements similar to FIG. 3 for explaining the effect of the display device 1 according to the exemplary embodiments.

Referring to FIG. 6, in a display device without the second capping layer 430 illustrated in FIG. 4, luminance ratios of red light R, blue light B, and green light G may be different at each viewing angle. In particular, at a certain angle X, there may be a difference Y large enough to cause the WAD phenomenon. If the difference Y can be reduced, the WAD phenomenon of the display device can be reduced.

For example, if the resonance efficiency of the blue light B and the green light G is increased compared with the red light R, the difference in luminance ratio between the red light R, the blue light B and the green light G may be reduced as illustrated in FIG. 7, thereby reducing the WAD phenomenon. Specifically, in a region R in which the second capping layer 430 is formed as illustrated in FIG. 8, if the resonance efficiency of the blue light B and the green light G is increased using the resonance structure of the first capping layer 420 and the second capping layer 430, the WAD phenomenon can be reduced.

Figure 9:
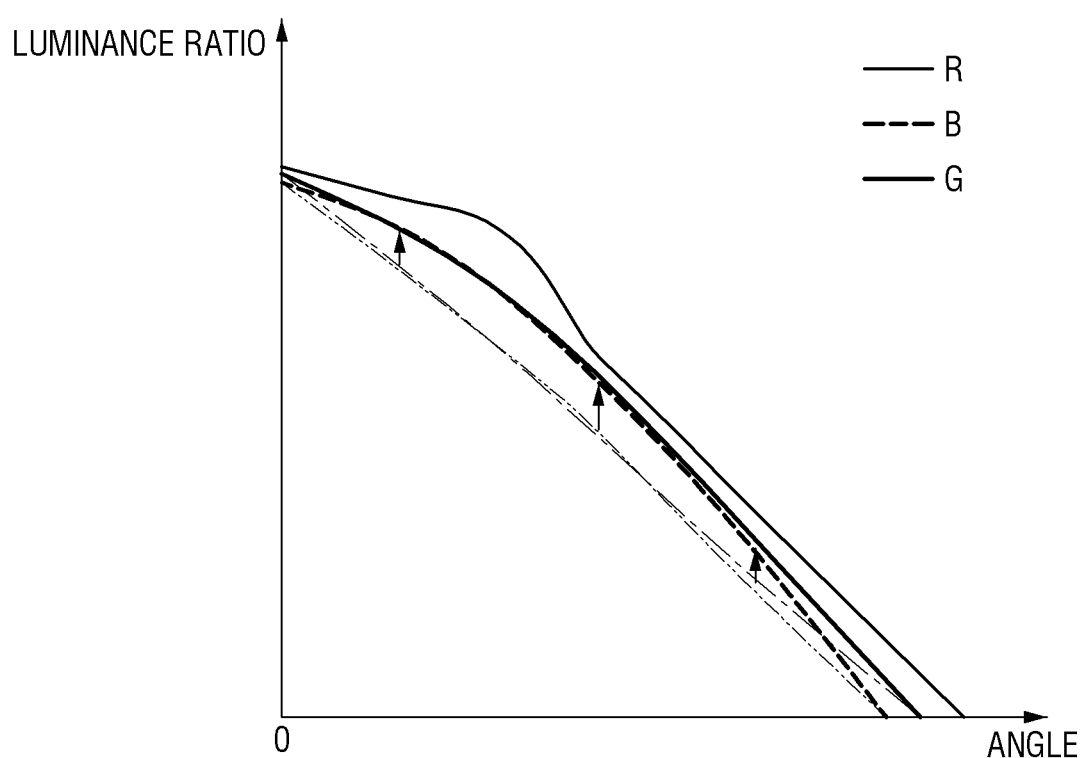

In addition, if the light scattering effect of the blue light B and the green light G is increased, the difference in luminance ratio between the red light R, the blue light B and the green light G is reduced as illustrated in FIG. 9, thereby reducing the WAD phenomenon. More specifically, in the region R in which the second capping layer 430 is formed as illustrated in FIG. 8, if the light scattering effect of the blue light B and the green light G is increased using a difference between refractive indices of the first capping layer 420 and the second capping layer 430, the WAD phenomenon can be reduced.

Figure 10:
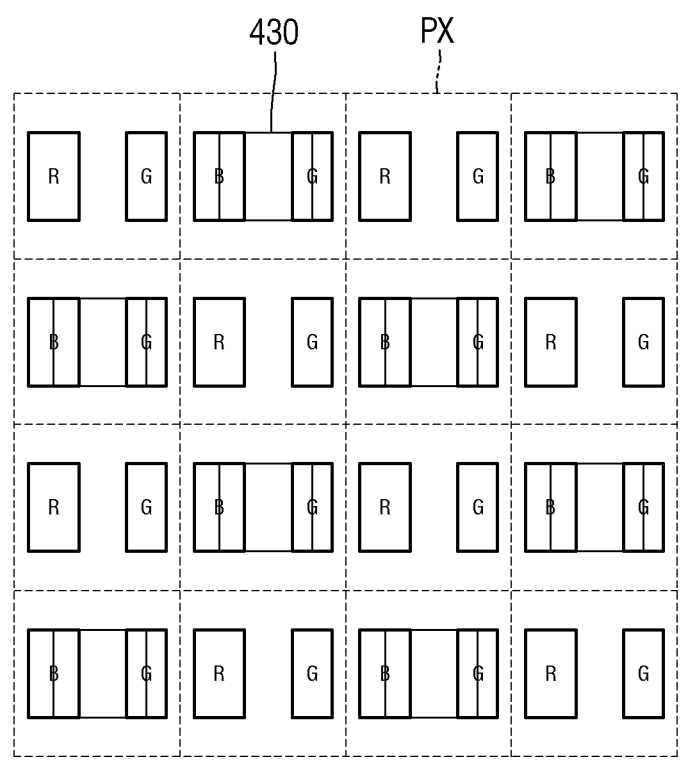
FIG. 10 illustrates a display device constructed according to an exemplary embodiment of the invention.

FIG. 10 illustrates a display device 2 constructed according to exemplary embodiments of the invention. A description of elements and features identical to those of the previous exemplary embodiments will be omitted to avoid redundancy, and the current exemplary embodiments will now be described, focusing mainly on differences from the previous exemplary embodiments.

Referring to FIG. 10, each pixel PX of the display device 2 may have a Pen Tile®-type pixel structure, but may have a different structure from the Pen Tile® pixel structure illustrated in FIG. 2. That is, one pixel PX formed by a red subpixel R and a green subpixel G adjacent to each other and one pixel PX formed by a blue subpixel B and a green subpixel G adjacent to each other may be alternately arranged in a horizontal line and a vertical line as illustrated in FIG. 2, but the arrangement of the red subpixel R, the blue subpixel B and the green subpixel G may be different from that of FIG. 2.

A second capping layer 430 of the display device 2 may not overlap the red subpixel R and may partially overlap the blue subpixel B and the green subpixel G.

Although FIG. 10 shows another Pen Tile® pixel structure, exemplary embodiments according to the technical spirit of the disclosure are not limited to this structure. The Pen Tile® pixel structure may also be modified to any form other than that illustrated in the drawing.

Figure 11:
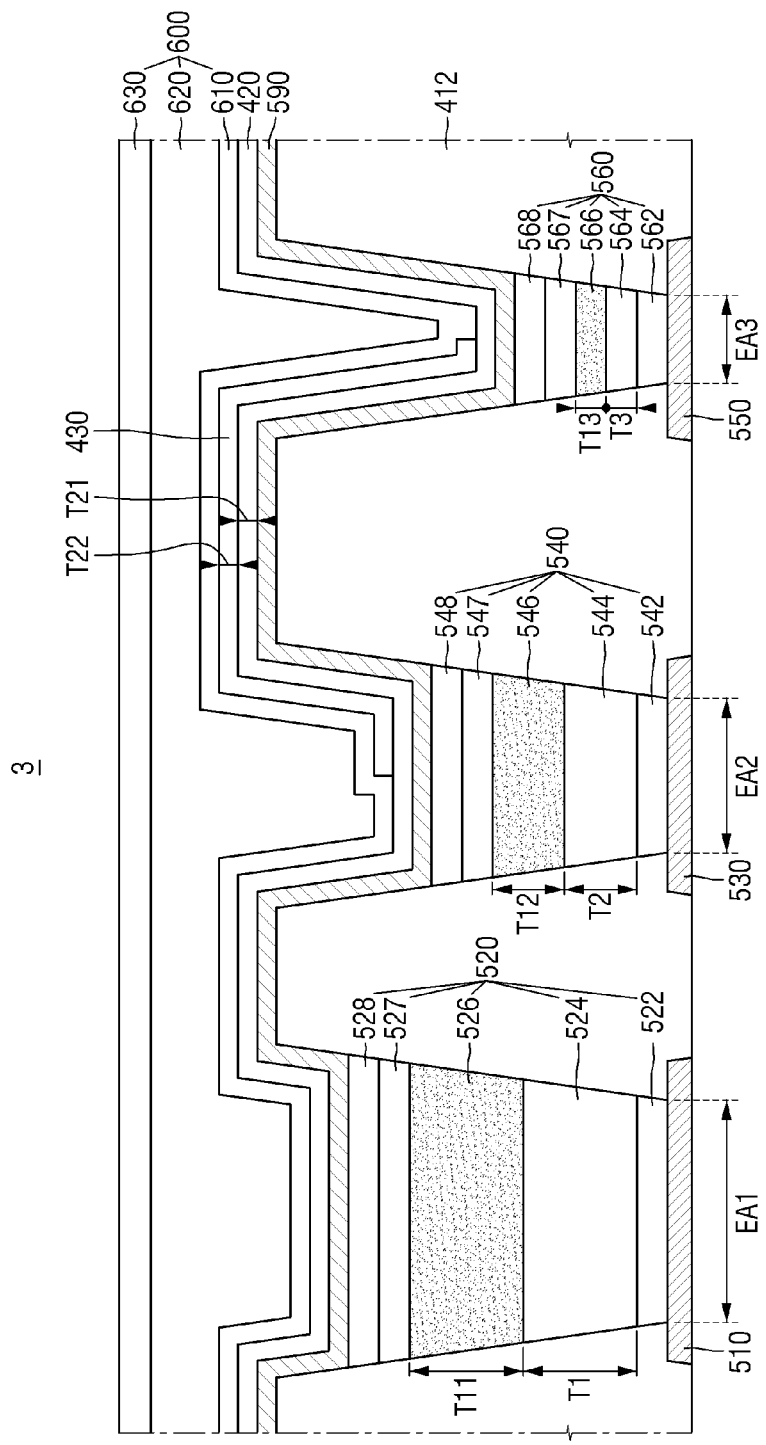
FIG. 11 illustrates an enlarged cross-sectional view of the organic light emitting elements of a display device constructed according to another exemplary embodiment.

FIG. 11 illustrates an enlarged cross-sectional view of the organic light emitting elements of a display device 3 constructed according to another exemplary embodiment. The current exemplary embodiments will now be described, focusing mainly on differences with the previous exemplary embodiments.

Referring to FIG. 11, a pixel defining layer 412 of the display device 3 may include first through third exposure areas EA1 through EA3 of different sizes.

Specifically, the cross-sectional area of the first exposure area EA1, the cross-sectional area of the second exposure area EA2, and the cross-sectional area of the third exposure area EA3 may be different from each other. More specifically, the cross-sectional area of the first exposure area EA1 may be larger than the cross-sectional area of the second exposure area EA2, and the cross-sectional area of the second exposure area EA2 may be larger than the cross-sectional area of the third exposure area EA3. Accordingly, when viewed from the front, the cross-sectional area of a red subpixel R (see FIG. 2) may be larger than the cross-sectional area of a blue subpixel B (see FIG. 2), and the cross-sectional area of the blue subpixel B (see FIG. 2) may be larger than the cross-sectional area of a green subpixel G.

Figure 12:
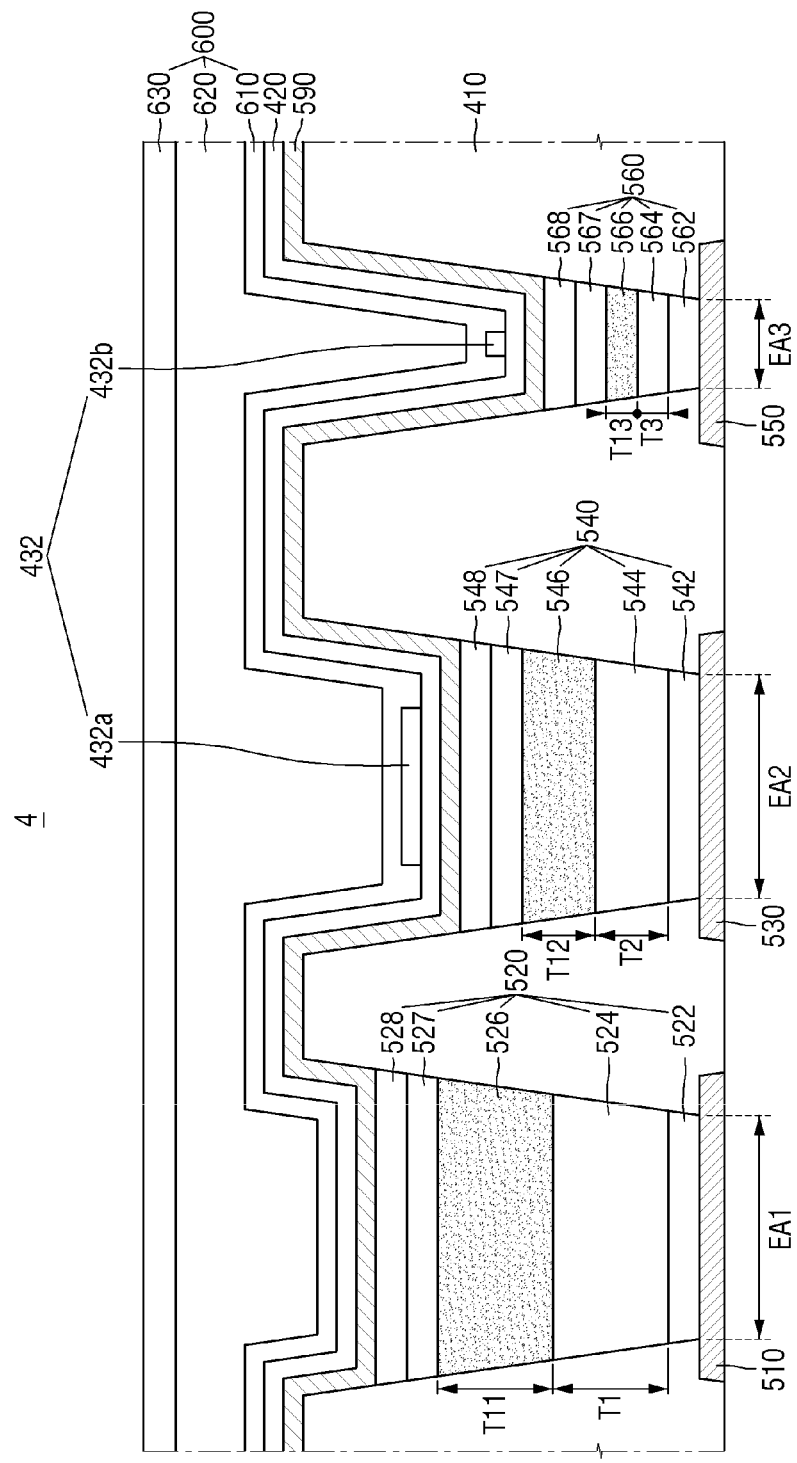
FIG. 12 illustrates an enlarged cross-sectional view of the organic light emitting elements of a display device constructed according to another exemplary embodiment.

FIG. 12 illustrates an enlarged cross-sectional view of the organic light emitting elements of a display device 4 constructed according to another exemplary embodiments. The current exemplary embodiments will now be described, focusing mainly on differences with the previous exemplary embodiments.

Referring to FIG. 12, a second capping layer 432 of the display device 4 may include a first sub-capping layer 432a and a second sub-capping layer 432b which are separated from each other.

The first sub-capping layer 432a may be disposed on a second organic light emitting layer 540, and the second sub-capping layer 432b may be disposed on a third organic light emitting layer 560 to be separated from the first sub-capping layer 432a.

The first sub-capping layer 432a may overlap only a part of an upper surface of the second organic light emitting layer 540. That is, the first sub-capping layer 432a may overlap a part of the upper surface of the second organic light emitting layer 540 and may not overlap the other part of the upper surface of the second organic light emitting layer 540. The second sub-capping layer 432b may overlap only a part of an upper surface of the third organic light emitting layer 560. That is, the second sub-capping layer 432b may overlap a part of the upper surface of the third organic light emitting layer 560 and may not overlap the other part of the upper surface of the third organic light emitting layer 560.

Figure 13:
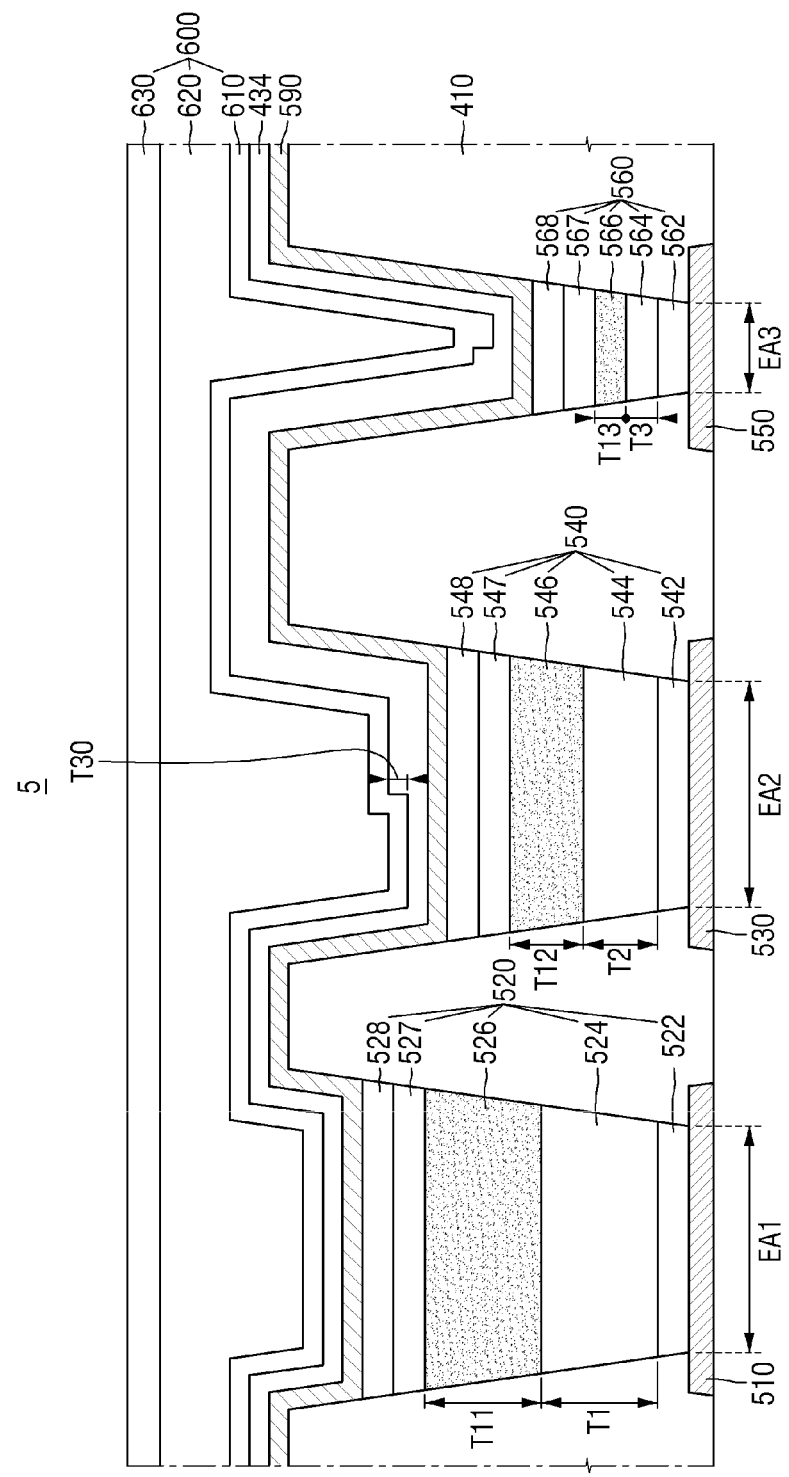
FIG. 13 illustrates an enlarged cross-sectional view of the organic light emitting elements of a display device constructed according to yet another exemplary embodiment.

FIG. 13 illustrates an enlarged cross-sectional view of the organic light emitting elements of a display device 5 constructed according to yet another exemplary embodiments. The current exemplary embodiments will now be described, focusing mainly on differences with the previous exemplary embodiments.

Referring to FIG. 13, the display device 5 may include a third capping layer 434 into which a first capping layer 420 (see FIG. 4) and a second capping layer 430 (see FIG. 4) are integrated. Accordingly, the third capping layer 434 disposed on a first organic light emitting layer 520 may not have a substantial height difference, but the third capping layer 434 disposed on third and fourth organic light emitting layers 540 and 560 may have a high portion and a low portion. Here, a height difference T30 between the high portion and the low portion may be about 400 Å to about 600 Å in order to minimize the WAD phenomenon.

A display device according to exemplary embodiments can improve the WAD phenomenon by increasing the resonance efficiency of some light emitting elements or by increasing the light scattering effect of some light emitting elements.

However, the effects of the exemplary embodiments are not restricted to the one set forth herein. The above and other effects of the exemplary embodiments will become more apparent to one of daily skill in the art to which the exemplary embodiments pertain by referencing the claims.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a first electrode disposed on a surface of a substrate, the first electrode including a first pixel electrode, a second pixel electrode, and a third pixel electrode;
a pixel defining layer disposed on the first electrode, the pixel defining layer including a first exposure area exposing the first pixel electrode, a second exposure area exposing the second pixel electrode, and a third exposure area exposing the third pixel electrode;
a first organic light emitting layer, a second organic light emitting layer, and a third organic light emitting layer disposed in the first, second, and third exposure areas, respectively, each of the first, second, and third light emitting layers including an upper surface;
a second electrode disposed on the first organic light emitting layer, the second organic light emitting layer, and the third organic light emitting layer;
a first capping layer disposed on the second electrode and overlapping the upper surfaces of the second, and third organic light emitting layers;
a second capping layer disposed on the first capping layer, the second capping layer overlapping the second organic light emitting layer and the third organic light emitting layer; and
an encapsulation layer covering the second capping layer, wherein the second organic light emitting layer includes a portion which does not overlap any one of the second capping layer and the pixel defining layer in a direction perpendicular to the surface of the substrate, and, wherein the third organic light emitting layer includes a portion which does not overlap any one of the second capping layer and the pixel defining layer in the direction perpendicular to the surface of the substrate.

2. The display device of claim 1, wherein the first organic light emitting layer comprises a first lower charge transport layer on the first pixel electrode and a first organic element layer on the first lower charge transport layer, and the second organic light emitting layer comprises a second lower charge transport layer on the second pixel electrode and a second organic element layer on the second lower charge transport layer, and wherein a thickness of the first lower charge transport layer and a thickness of the second lower charge transport layer are different from each other.

3. The display device of claim 2, wherein the thickness of the first lower charge transport layer is greater than the thickness of the second lower charge transport layer.

4. The display device of claim 2, wherein the third organic light emitting layer comprises a third lower charge transport layer on the third pixel electrode and a third organic element layer on the third lower charge transport layer, and wherein the thickness of the second lower charge transport layer is greater than a thickness of the third lower charge transport layer.

5. The display device of claim 2, wherein a thickness of the first organic element layer and a thickness of the second organic element layer are different from each other.

6. The display device of claim 2, wherein the thickness of the first organic element layer is greater than the thickness of the second organic element layer.

7. The display device of claim 2, wherein the third organic light emitting layer comprises a third lower charge transport layer on the third pixel electrode and a third organic element layer on the third lower charge transport layer, and wherein the thickness of the second organic element layer is greater than a thickness of the third organic element layer.

8. The display device of claim 1, wherein the second capping layer has opposed ends, with one end of the second capping layer overlapping the upper surface of the second organic light emitting layer, and the other end of the second capping layer overlapping the upper surface of the third organic light emitting layer.

9. The display device of claim 1, wherein the second capping layer comprises a third capping layer and a fourth capping layer separated from each other, wherein the third capping layer is disposed on the second organic light emitting layer, and the fourth capping layer is disposed on the third organic light emitting layer.

10. The display device of claim 1 wherein the first and second capping layers are integrated into one layer.

11. The display device of claim 1, wherein a cross-sectional area of the first exposure area is larger than a cross-sectional area of the third exposure area.

12. The display device of claim 11, wherein the cross-sectional area of the first exposure area is larger than a cross-sectional area of the second exposure area, and the cross-sectional area of the second exposure area is larger than the cross-sectional area of the third exposure area.

13. The display device of claim 1, wherein the first, second, and third exposure areas are disposed in a matrix structure in which the first and second exposure areas are repeatedly disposed in any one column, and the third exposure areas are repeatedly disposed to be adjacent to the column in which the first and second exposure areas are repeatedly disposed.

14. The display device of claim 1, wherein the first capping layer and the second capping layer have different optical refractive indices, and a difference between the optical refractive indices of the first capping layer and the second capping layer is about 0.9 or less.

15. The display device of claim 1, wherein the first capping layer has a first thickness, and the second capping layer has a second thickness, wherein the first thickness is about 1000 Å or less, and the second thickness is about 400 Å to about 600 Å.

16. A display device comprising:
a first electrode including a first pixel electrode and a second pixel electrode;
a pixel defining layer on the first electrode, the pixel defining layer including a first exposure area exposing the first pixel electrode and a second exposure area exposing the second pixel electrode;
a first lower charge transport layer disposed on the first pixel electrode, disposed in the first exposure area and having a first thickness;
a second lower charge transport layer disposed on a surface of the second pixel electrode, disposed in the second exposure area and having a second thickness different from the first thickness;
a first organic element layer disposed on the first lower charge transport layer and having a third thickness and an upper surface;
a second organic element layer disposed on the second lower charge transport layer and having a fourth thickness different from the third thickness and an upper surface;
a second electrode disposed on the first and second organic element layers;
a first capping layer disposed on the second electrode and overlapping the upper surfaces of the first and second organic element layers; and
a second capping layer disposed on the first capping layer that does not overlap the upper surface of the first organic element layer, and overlaps the second organic element layer,
wherein the second organic element layer includes a portion which does not overlap any one of the second capping layer and the pixel defining layer in a direction perpendicular to the surface of the second pixel electrode.

17. The display device of claim 16, wherein the first thickness is greater than the second thickness, and the third thickness is greater than the fourth thickness.

18. The display device of claim 16, further comprising:
a third lower charge transport layer disposed on a third pixel electrode, disposed in a third exposure area exposing the third pixel electrode and having a fifth thickness different from the first and second thicknesses; and
a third organic element layer disposed on the third lower charge transport layer and having a sixth thickness different from the third and fourth thicknesses,
wherein the second electrode is disposed on the third organic element layer, the first capping layer overlaps an upper surface of the third organic element layer, and the second capping layer overlaps the third organic element layer,
wherein the third organic element layer includes a portion which does not overlap any one of the second capping layer and the pixel defining layer in the direction perpendicular to the surface of the second pixel electrode.

19. The display device of claim 18, wherein the first thickness is greater than the second thickness, and the second thickness is greater than the fifth thickness.

20. The display device of claim 19, wherein the third thickness is greater than the fourth thickness, and the fourth thickness is greater than the sixth thickness.

* * * * *